(12) United States Patent
Nitadori et al.

(10) Patent No.: US 7,896,648 B2
(45) Date of Patent: Mar. 1, 2011

(54) VERTICAL HEAT PROCESSING APPARATUS AND HEAT PROCESSING METHOD USING THE VERTICAL HEAT PROCESSING APPARATUS

(75) Inventors: Hiromi Nitadori, Oshu (JP); Katsuyuki Hishiya, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 480 days.

(21) Appl. No.: 12/010,746

(22) Filed: Jan. 29, 2008

(65) Prior Publication Data
US 2008/0199818 A1    Aug. 21, 2008

(30) Foreign Application Priority Data
Jan. 30, 2007    (JP)    ............... 2007-019379

(51) Int. Cl.
*F27D 3/12*    (2006.01)
(52) U.S. Cl. ...................... 432/241; 414/940
(58) Field of Classification Search ............... 219/209, 219/390, 405, 406; 438/715, 716; 432/241, 432/243, 247, 249, 6; 414/935, 937, 940, 414/941
See application file for complete search history.

(56) References Cited

U.S. PATENT DOCUMENTS
5,048,164 A * 9/1991 Harima ...................... 29/25.01

(Continued)

FOREIGN PATENT DOCUMENTS
JP    11-74205    3/1999

(Continued)

OTHER PUBLICATIONS
Notification of Reasons for Rejection issued on Jan. 6, 2009.

(Continued)

*Primary Examiner*—Gregory A Wilson
(74) *Attorney, Agent, or Firm*—Smith, Gambrell & Russell, LLP

(57) ABSTRACT

The present invention is a vertical heat processing apparatus comprising: a heat processing furnace having a furnace opening; a lid member for closing the furnace opening of the heat processing furnace; a first substrate holder and a second substrate holder, each of which is capable of holding a plurality of substrates in a tier-like manner and of being alternately placed on the lid member through a heat retention tube; an elevating mechanism that vertically moves the lid member to load one of the substrate holders into the heat processing furnace, and to unload the one of the substrate holders from the heat processing furnace; a holder table configured to be placed thereon the other of the substrate holders for transfer of the substrates, when the one of the substrate holders is in the heat processing furnace; and a holder conveying mechanism configured to convey the respective substrate holders between the holder table and the heat retention tube; wherein the holder table is provided with a holder gripping mechanism for gripping the substrate holder to prevent turnover thereof.

6 Claims, 11 Drawing Sheets

U.S. PATENT DOCUMENTS

| | | | | |
|---|---|---|---|---|
| 5,055,036 | A | * | 10/1991 | Asano et al. .................... 432/5 |
| 5,236,181 | A | * | 8/1993 | Ishii et al. .................... 266/252 |
| 5,356,261 | A | * | 10/1994 | Nishi ...................... 414/744.7 |
| 5,407,181 | A | * | 4/1995 | Ohsawa ...................... 266/257 |
| 5,829,969 | A | * | 11/1998 | Miyashita et al. ........... 432/253 |
| 6,206,974 | B1 | * | 3/2001 | Iida et al. .................... 118/719 |
| 6,244,422 | B1 | * | 6/2001 | Bai ........................ 198/464.4 |
| 6,573,198 | B2 | * | 6/2003 | Boonstra et al. ............ 438/795 |
| 2001/0016307 | A1 | * | 8/2001 | Ishii .......................... 432/239 |
| 2002/0023458 | A1 | | 2/2002 | Sakata et al. |
| 2009/0269933 | A1 | * | 10/2009 | Yamaguchi et al. ......... 438/706 |

FOREIGN PATENT DOCUMENTS

| | | |
|---|---|---|
| JP | 2002-176044 | 6/2002 |
| JP | 3378241 | 12/2002 |
| JP | 203-258063 | 9/2003 |

OTHER PUBLICATIONS

Chinese Office Action issued on May 10, 2010 for Application No. 200810009041.1 with English translation.

* cited by examiner

VERTICAL HEAT PROCESSING APPARATUS AND HEAT PROCESSING METHOD USING THE VERTICAL HEAT PROCESSING APPARATUS

CROSS REFERENCE TO RELATED APPLICATIONS

This application is based upon the prior Japanese Patent Application No. 2007-019379 filed on Jan. 30, 2007, the entire contents of which are incorporated herein by reference.

FIELD OF THE INVENTION

The present invention relates to a vertical heat processing apparatus, and a heat processing method using the vertical heat processing apparatus.

BACKGROUND ART

In a manufacturing process of a semiconductor device, a semiconductor wafer (substrate) is subjected to various processes such as an oxidation process, a film deposition process, and so on. As an apparatus for performing these processes, there has been used, for example, a vertical heat processing apparatus (semiconductor manufacturing apparatus) that is capable of processing a number of wafers as a batch (see, e.g., Japanese Patent Publication No. 3378241). The vertical heat processing apparatus includes a vertical heat processing furnace having a furnace opening in a lower part thereof, and a loading area (conveyance area) formed below the heat processing furnace. In the loading area, a boat (substrate holder) for holding thereon a number of (about 100 to 150) large wafers, e.g., 300 mm wafers is placed, via a heat-retention tube, on an upper part of a lid member for opening and closing the furnace opening. In the loading area, there are also disposed: an elevating mechanism for vertically moving the lid member so as to load the boat into the heat processing furnace and to unload the boat therefrom; a conveying mechanism that conveys the wafers between a carrier (container), which can contain a plurality of wafers, and the boat; and so on.

Generally, the boat is made of quartz and thus is very expensive. The wafer(s) is also generally expensive, and a manufacturing cost for that is increased as the process proceeds. Therefore, they should be carefully handled.

However, it is difficult to provide an earthquake resistant structure and/or earthquake resistant capability to the conventional batch type of semiconductor manufacturing apparatus because many restrictions exist in terms of both hardwares and softwares. Thus, sufficient countermeasures have not been taken against an earthquake conventionally. Thus, if an earthquake happens and severely shakes the apparatus, there is a possibility that the boat turns over and/or the boat and the wafers break, resulting in a serious damage.

In order to avoid such a risk, in the vertical heat processing apparatus described in the above patent document, there is employed a structure in which a bottom plate of the substrate holder and the heat retention tube are securely connected to each other by a substrate-holder securing member.

In addition, in a vertical heat processing apparatus, it is preferable to use two boats in such a manner that, while one boat loaded in a heat processing furnace is being subjected to a heat process, the other boat is placed on a boat table and wafers are conveyed to or from the other boat. This is called "two-boat system".

However, in a vertical heat processing apparatus adopting the two-boat system, since the one boat on the heat retention tube is replaced with the other boat, it is difficult to employ the structure as described in the above patent document, i.e., the structure in which the heat retention tube and the substrate holder are securely connected by a substrate-holder securing member.

SUMMARY OF THE INVENTION

The present invention has been made in order to solve the above problem. The object of the present invention is to provide a vertical heat processing apparatus in which turnover of a boat by an external force such as an earthquake can be prevented by a simple structure, while the two-boat system is adopted, and a heat processing method using the vertical heat processing apparatus.

The present invention is a vertical heat processing apparatus comprising: a heat processing furnace having a furnace opening; a lid member for closing the furnace opening of the heat processing furnace; a first substrate holder and a second substrate holder, each of which is capable of holding a plurality of substrates in a tier-like manner and of being alternately placed on the lid member through a heat retention tube; an elevating mechanism that vertically moves the lid member to load one of the substrate holders into the heat processing furnace, and to unload the one of the substrate holders from the heat processing furnace; a holder table configured to be placed thereon the other of the substrate holders for transfer of the substrates, when the one of the substrate holders is in the heat processing furnace; and a holder conveying mechanism configured to convey the respective substrate holders between the holder table and the heat retention tube; wherein the holder table is provided with a holder gripping mechanism for gripping the substrate holder to prevent turnover thereof.

According to the present invention, there is provided the vertical heat processing apparatus in which turnover of the boat by an external force such as an earthquake can be prevented by such a simple structure, while the two-boat system is adopted;

Specifically, for example, each of the substrate holders includes an annular bottom plate, positioning engagement grooves are formed in an inner circumference of the bottom plate, the holder table is provided with a holder positioning mechanism having a pair of rollers that can be moved closer to and away from each other to narrow and widen a distance therebetween, the holder positioning mechanism is adapted to position the substrate holder by enlarging the distance between the pair of rollers to thereby engage the pair of rollers respectively with the positioning engagement grooves, and the holder gripping mechanism includes a gripping part for gripping the bottom plate when the pair of rollers are positioned away from each other.

Alternatively, for example, each of the substrate holders includes an annular bottom plate, positioning engagement grooves are formed in an inner circumference of the bottom plate, the holder table is provided with a holder positioning mechanism having a pair of rollers, each of which can change a posture thereof between an inclined position that is radially inward inclined and an upright position, the holder positioning mechanism is adapted to position the substrate holder by making upright the pair of rollers to thereby engage the pair of rollers respectively with the positioning engagement grooves, and the holder gripping mechanism includes a gripping part for gripping the bottom plate when the pair of rollers are positioned upright.

Alternatively, for example, each of the substrate holders includes an annular bottom plate, positioning engagement grooves are formed in an inner circumference of the bottom plate, the holder table is provided with a holder positioning mechanism having a pair of rollers that can be moved closer to and away from each other to narrow and widen a distance therebetween and that can be rotated about axes thereof, the holder positioning mechanism is adapted to position the substrate holder by enlarging the distance between the pair of rollers and by rotating the pair of rollers to thereby engage the pair of rollers respectively with the positioning engagement grooves, and the holder gripping mechanism includes a gripping part for gripping the bottom plate when the pair of rollers are positioned away from each other and rotated.

In addition, the present invention is a method of thermally processing a plurality of substrates using a vertical heat processing apparatus having any of the above features, the method comprising the steps of: causing the one of the substrate holders to hold a plurality of substrates in a tier-like manner; placing the one substrate holder holding the plurality of substrates in a tier-like manner, on the lid member for closing the furnace opening of the heat processing furnace, through the heat retention tube; elevating the lid member to load the one substrate holder into the heat processing furnace; thermally processing the substrates held by the one substrate holder in the heat processing furnace; causing the holder table to grip the other of the substrate holders to prevent turnover thereof; transferring substrates to or from the other substrate holder placed on the holder table, during the thermal processing step; and replacing the one substrate holder on the heat retention tube, which has been unloaded from the heat processing furnace, with the other substrate holder on the holder table, after the thermal processing step.

BEST MODE FOR CARRYING OUT THE INVENTION

Figure 1:
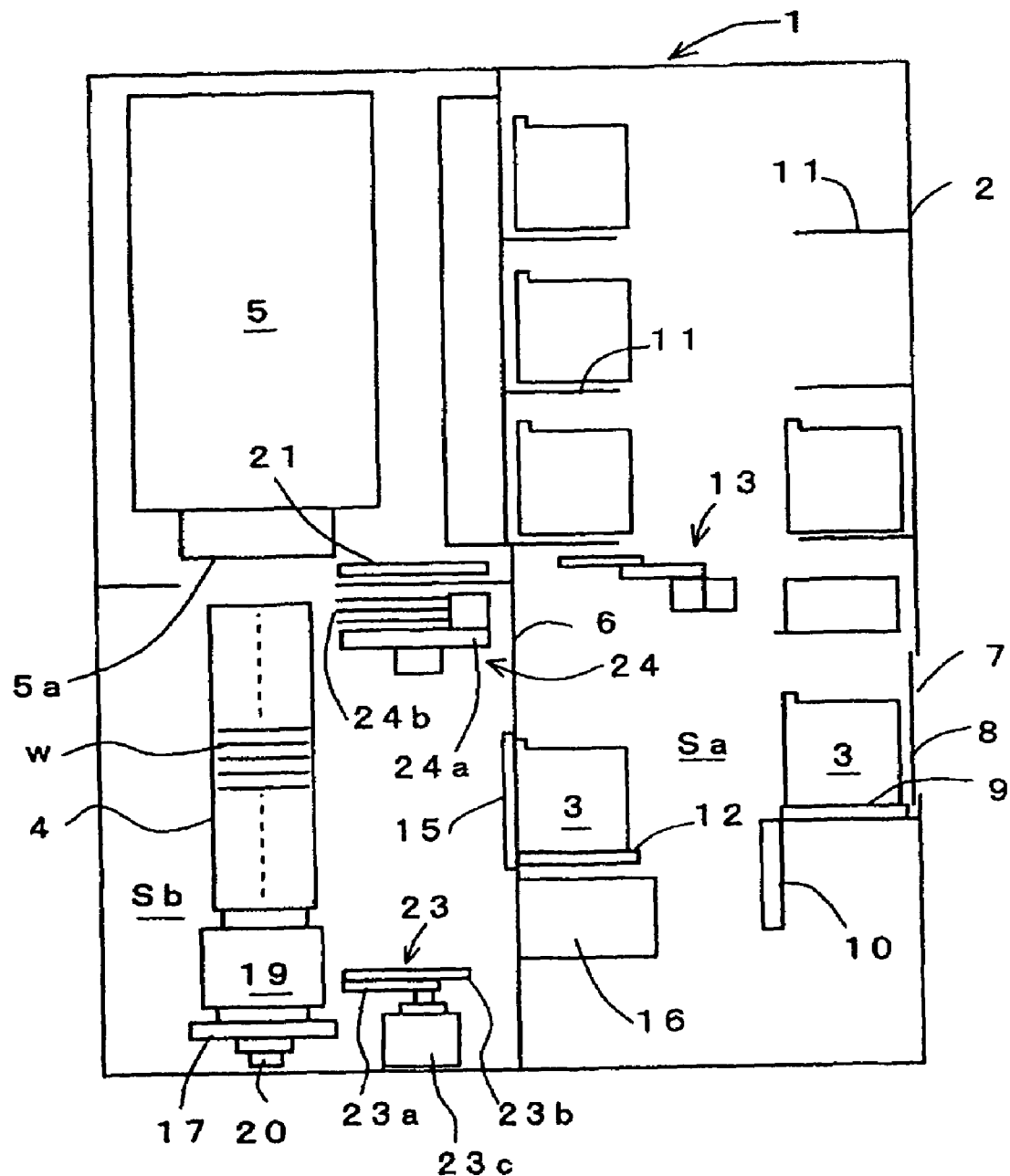
FIG. 1 is a longitudinal sectional view schematically showing a vertical heat processing apparatus according to one embodiment of the present invention.
Figure 2:
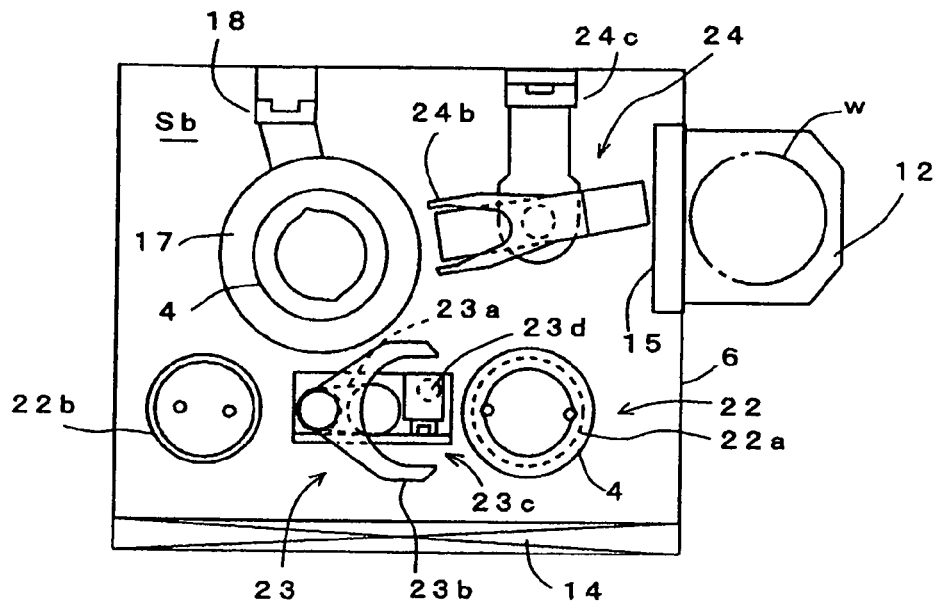
FIG. 2 is a plan view schematically showing a layout in a loading area of the vertical heat processing apparatus shown in FIG. 1.
Figure 3:
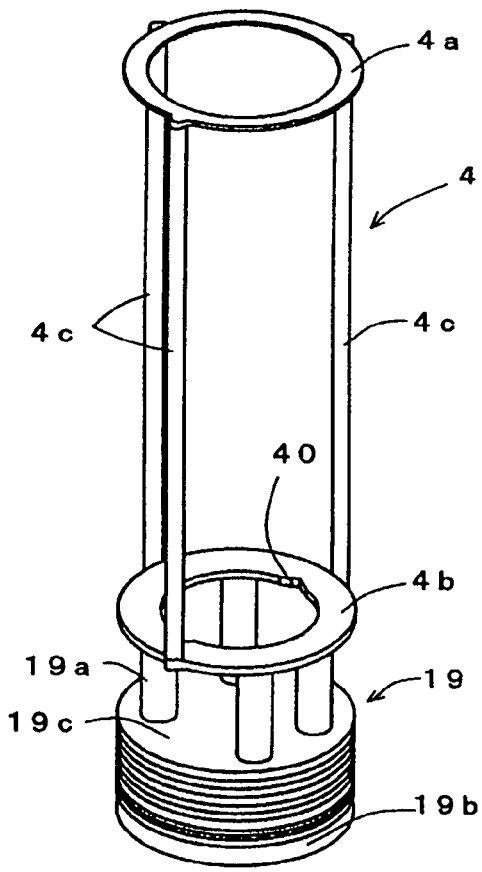
FIG. 3 is a perspective view schematically showing how a wafer boat is placed on a heat retention tube.
Figure 4:
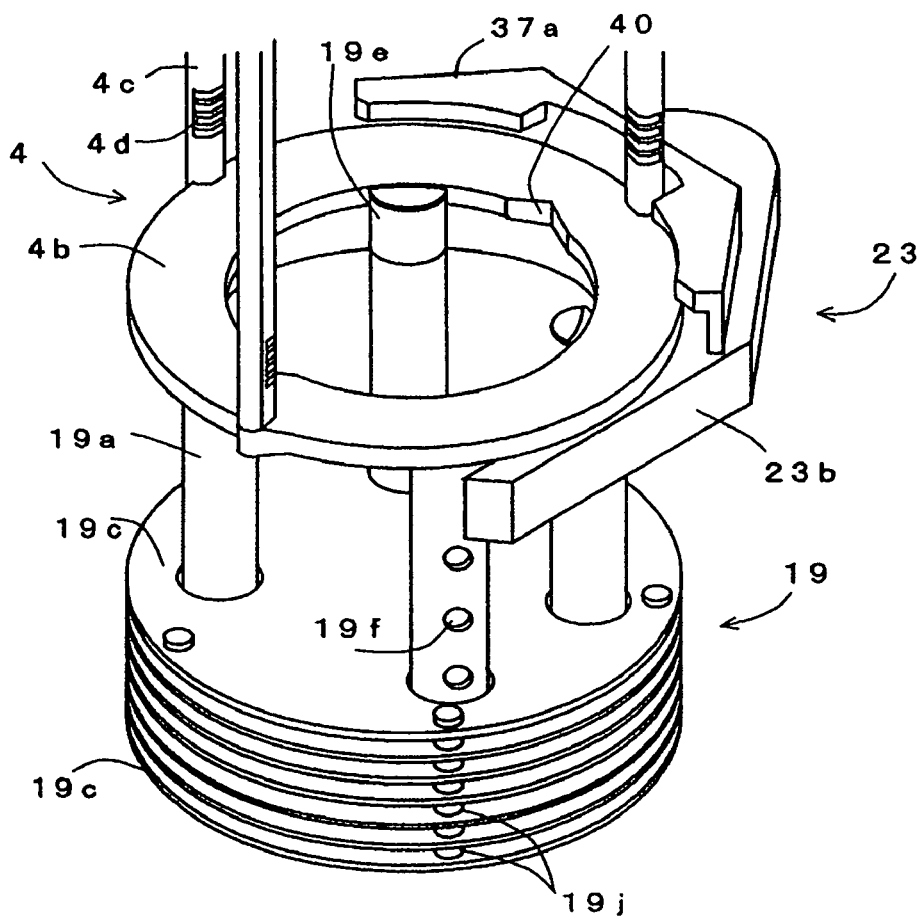
FIG. 4 is a perspective view showing a state in which the wafer boat is placed on the heat retention tube by a transferring mechanism.
Figure 5:
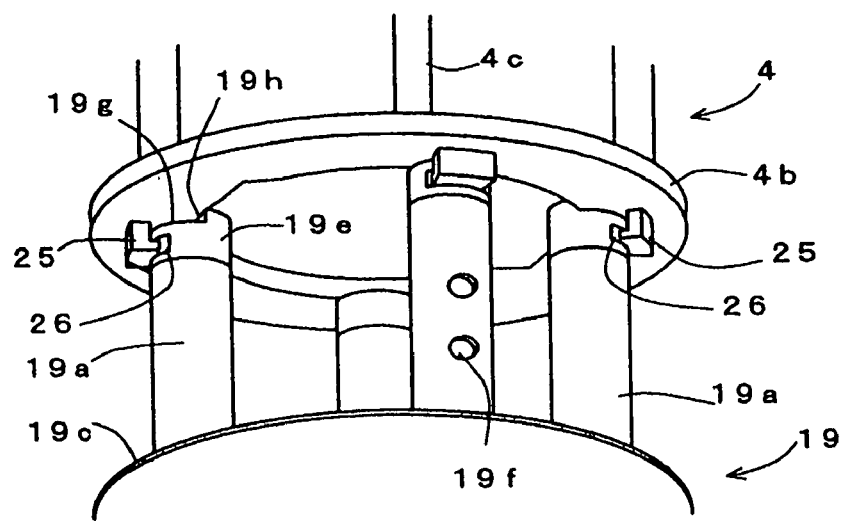
FIG. 5 is a perspective view showing a state in which a locking part and a part to be locked have been locked to each other.
Figure 6:
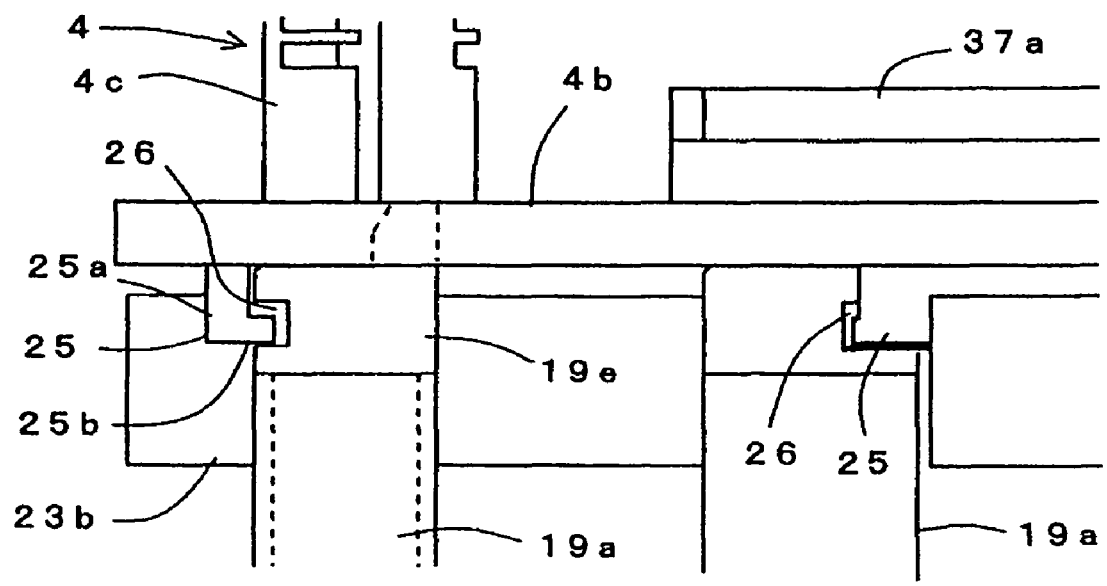
FIG. 6 is a side view showing a state in which the wafer boat has been placed on the heat retention tube.
Figure 7:
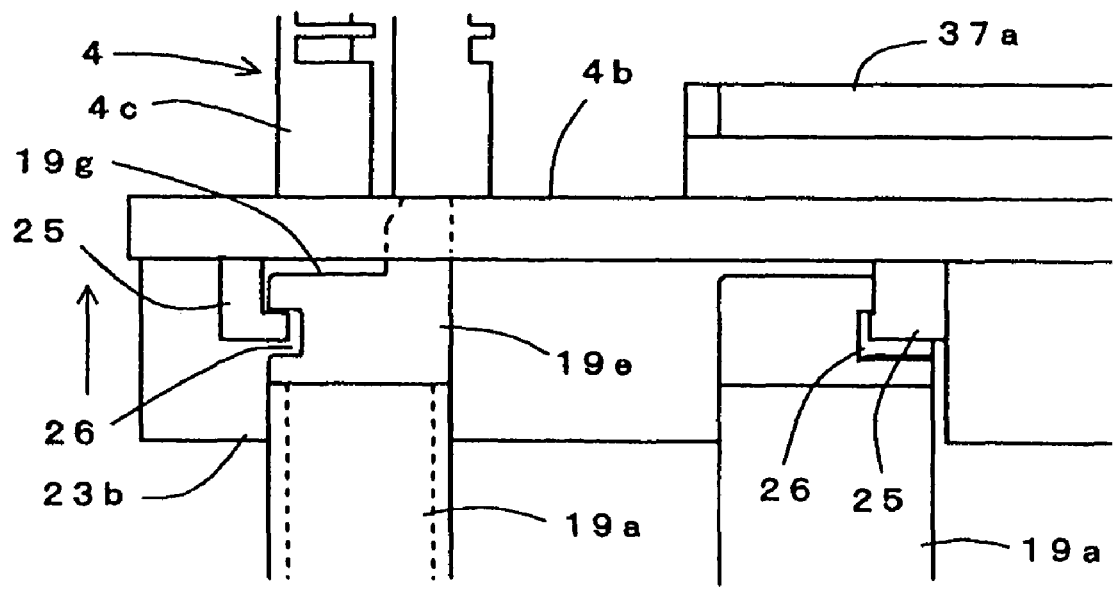
FIG. 7 is a side view showing a state in which the wafer boat has been raised by a predetermined height from the heat retention tube.
Figure 8:
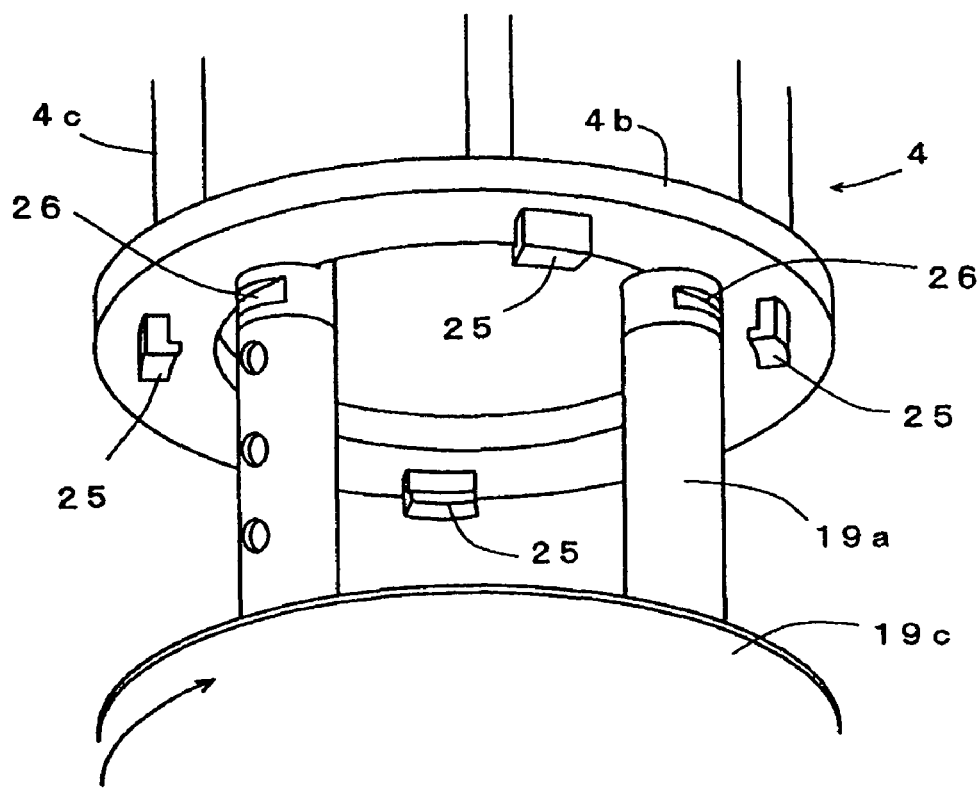
FIG. 8 is a perspective view showing an unlockable state which is created by rotating the heat retention tube after the wafer boat has been raised by a predetermined height.
Figure 9:
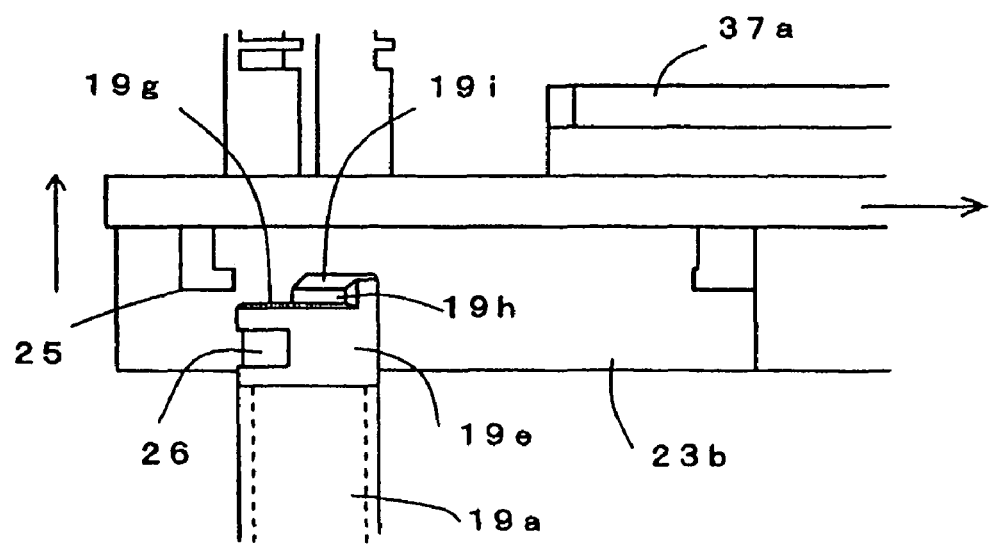
FIG. 9 is a side view showing a state in which the wafer boat has been further raised by another predetermined height from the heat retention tube, and the wafer boat is laterally conveyed.

The best mode for carrying out the present invention is described in detail below, with reference to the attached drawings. FIG. 1 is a longitudinal sectional view schematically showing a vertical heat processing apparatus according to one embodiment of the present invention. FIG. 2 is a plan view schematically showing a layout in a loading area of the vertical heat processing apparatus shown in FIG. 1. FIG. 3 is a perspective view schematically showing how a wafer boat is placed on a heat retention tube. FIG. 4 is a perspective view showing a state in which the wafer boat is placed on the heat retention tube by a transferring mechanism. FIG. 5 is a perspective view showing a state in which a locking part and a part to be locked have been locked to each other.

In FIGS. 1 and 2, the reference number 1 depicts a vertical heat processing apparatus as a semiconductor manufacturing apparatus to be installed in a clean room. The vertical heat processing apparatus 1 includes a housing 2 defining a contour of the apparatus. In the housing 2, there are a transfer and storage area Sa and a loading area Sb. In the transfer and storage area Sa, a carrier 3 serving as a container for containing a plurality of substrates such as semiconductor wafers w is transferred and stored. The loading area Sb is a working area (transfer area) in which the wafers are transferred between a boat 4, which can hold a number of, e.g., about 100 to 150 wafers in a tier-like manner at predetermined vertical pitches, and the carrier 3. In addition, the boat 4 is loaded into a heat processing furnace 5 and is unloaded therefrom in the loading area Sb. The transfer and storage area Sa and the loading area Sb are separated by a partition wall 6.

The carrier 3 is a plastic container which is capable of containing and carrying a plurality of, e.g., about 13 to 25 wafers of a predetermined diameter such as 300 mm diameter, with the wafers being horizontally arranged in a tier-like manner at predetermined vertical intervals therebetween. A wafer inlet/outlet port is formed in a front surface of the carrier 3. A lid for hermetically sealing the wafer inlet/outlet port is detachably attached to the carrier 3 (illustration omitted).

A loading/unloading port 7 is formed in a front surface of the housing 2, through which the carrier 3 is loaded and unloaded by an operator or a transfer robot. The loading/unloading port 7 is equipped with a door 8 which is vertically slidable to open and close the loading/unloading port 7. A table 9 on which the carrier 3 can be placed is disposed near the loading/unloading port 7 in the transfer and storage area Sa. Located on a rear part of the table 9 is a sensor mechanism 10 that opens the lid of the carrier 3 and detects positions of wafers w and the number thereof. There are storage racks 11 for storing the carriers 3 above the table 9 and above the partition wall 6.

In the transfer and storage area Sa, a transfer stage 12, on which the carrier 3 is placed for transfer of the wafers, is disposed on a side of the partition wall 6. In addition, disposed in the transfer and storage area Sa is a carrier conveying mechanism 13 that conveys the carriers 3 among the table 9, the storage racks 11, and the transfer stage 12.

An atmosphere in the transfer and storage area Sa is an atmospheric air cleaned by an air cleaner (fan filter unit), not shown. An atmosphere in the loading area Sb is an atmospheric air of positive pressure which has been cleaned by an air cleaner (fan filter unit) 14 disposed on one side of the loading area Sb, or an inert gas (e.g., $N_2$ gas) atmosphere. The partition wall 6 has an opening, not shown. An inside of the carrier 3 and an inside of the loading area Sb can be communicated with each other through the opening, when the front surface of the carrier 3 placed on the transfer stage 12 is brought into contact with the opening from a side of the transfer and storage area Sa. The partition wall 6 is provided with a openable and closable door 15 that closes the opening on a side of the loading area Sb. The opening is formed to have a size substantially the same as that of the inlet/outlet port of the carrier 3, so that the wafers in the carrier 3 can be taken in and taken out through the opening.

The door 15 is provided with a lid open/close mechanism, not shown, for opening and closing the lid of the carrier 3. The door 15 also has a door open/close mechanism, not shown, for opening and closing the door 15 from the side of the loading area Sb. Due to the lid open/close mechanism and the door open/close mechanism, the door 15 and the lid of the carrier 3 can be opened and moved to the loading area Sb. Further, the door 15 and the lid of the carrier 3 can be moved (evacuated) upward or downward so as not to disturb the transfer of the wafers.

Below the transfer stage 12, there is disposed a notch aligning mechanism 16 for aligning notches (cutouts), which are formed in a peripheral part of each wafer for conforming its crystal direction, in the same direction. The notch aligning mechanism 16 faces the loading area Sb and is opened thereto. The notch aligning mechanism 16 is adapted to align the notches of wafers which are transferred from the carrier 3 on the transfer stage 12 by a below-described transferring mechanism 24.

A vertical heat processing furnace 5 having a furnace opening 5a in a lower part thereof is located in the loading area Sb on a back and upper side thereof. In the loading area Sb, a boat 4 made of, e.g., quartz which holds a number of, e.g., about 100 to 150 wafers w at predetermined vertical intervals in a tier-like manner is placed, through a heat retention tube 19, on an upper part of a lid member 17 for opening and closing the furnace opening 5a. The loading area Sb is equipped with an elevating mechanism 18 for vertically moving the lid member 17 so as to load the boat 4 into the heat processing furnace 5 and unload the boat 4 therefrom. The heat retention tube (heat shielding member) 19 disposed above the lid member 17 is configured to restrain heat release from the furnace opening 5a when the lid member 17 is closed. The boat 4 is disposed on an upper part of the heat retention tube 19. The heat processing furnace 5 is mainly composed of a reaction tube and a heating device (heater) disposed around the reaction tube. Connected to the reaction tube are a gas introducing system for introducing a process gas and/or an inert gas (e.g., $N_2$), and an exhaust system capable of evacuating the reaction tube and reducing a pressure therein to a predetermined vacuum degree.

The lid member 17 is provided with a rotating mechanism 20 that rotates the boat 4 through the heat retention tube 19. Disposed near the furnace opening 5a is a shutter 21 that can be horizontally moved (turned) to be opened and closed. The shutter 21 shields the furnace opening 5a, after the lid member 17 is opened and the thermally processed boat 4 is unloaded. The shutter 21 is connected to a shutter driving mechanism, not shown, that turns the shutter 21 in the horizontal direction so as to open and close the same.

On one side of the loading area Sb, namely, on the side of the air cleaner 14, there is disposed a boat table (also referred to as "boat stage" or "holder table") 22 on which the boat 4 is placed for the transfer of the wafers w. The number of the boat table 22 may be one. However, as shown in FIG. 2, the number thereof is preferably two, i.e., a first table (charge stage) 22a and a second table (standby stage) 22b which are positioned along the air cleaner 14 in a forward and rearward direction.

In a lower part of the loading area Sb, there is located a boat conveying mechanism (holder conveying mechanism) 23 between the first table 22a and the second table 22b. The boat conveying mechanism 23 conveys the boat 4 between the first table 22a or the second table 22b (of the boat table 22) and the heat retention tube 19 on the lid member 17 that is lowered, and between the first table 22a and the second table 22b. In the loading area Sb, there is disposed the transferring mechanism 24 that transfers wafers w between the carrier 3 on the transfer stage 12 and the boat 4 on the boat table 22, to be specific, between the carrier 3 on the transfer stage 12 and the notch aligning mechanism 16, between the notch aligning mechanism 16 and the boat 4 on the first table 22a (of the boat table 22), and between the thermally processed boat 4 on the first table 22 and a vacant carrier 3 on the transfer stage 12.

As shown in FIG. 3, the boat 4 has a structure in which a plurality of, e.g., three columns 4c are interposed between a top plate 4a and a bottom plate 4b. Comb-like grooves 4d for holding wafers w in a tier-like manner are formed in each column 4c at predetermined pitches. A distance between the right and left columns 4c facing the front is wide so as to allow passage of each wafer.

The boat conveying mechanism 23 has a horizontally stretchable arm that horizontally moves one boat 4 while vertically supporting the same. Specifically, the boat conveying mechanism 23 includes: a first arm 23a that is horizontally turnable and vertically movable; a second arm 23b of substantially a U-shape in plan view which is pivotably mounted on a distal end of the first arm 23a to be capable of horizontally turning, the second arm 23b capable of supporting a lower surface of the boat 4 (lower surface of the bottom plate 4b); a driving part 23c for driving the first arm 23a and the second arm 23b; and an elevating mechanism 23d for vertically moving these members together. By synchronizing the horizontal turning movements of the first arm 23a and the second arm 23b, the boat can be horizontally, linearly transferred. Owing to this stretchable mechanism of the arms, it is possible to minimize an area required for conveying the boat 4 as much as possible. Thus, the width and length dimensions of the apparatus can be saved.

The transferring mechanism 24 has a structure in which a plurality of, e.g., five thin-plate-like transferring arms 24b, each of which can place thereon a semiconductor wafer and can be moved forward and rearward, are disposed on a horizontally rotatable base 24a. Preferably, the central transferring arm (of the five transferring arms) for transferring a single wafer, and the other four transferring arms (group) are independently moved forward and rearward on the base 24a. In addition, it is preferable that vertical pitches of the other four transferring arms (group) with respect to the central transferring arm can be varied. The base 24a can be vertically moved by an elevating mechanism 24c disposed on the other side of the loading area Sb.

As shown in FIGS. 5 to 9, in order to prevent turnover of the boat 4 placed on the heat retention tube 19 by an external force such as an earthquake, an upper part of the heat retention tube 19 and the bottom plate 4b of the boat 4 are equipped with a hook part 25 as a locking part and a hook groove part 26 as a part to be locked. The hook part 25 and the hook groove part 26 can be locked to each other or unlocked from each other, by causing the heat retention tube 19 to rotate by means of the rotating mechanism 20 by a predetermined angle, e.g., by 90 degrees, under a state in which the boat 4 has been conveyed by the boat conveying mechanism 23 to a position directly above the heat retention tube 19.

As shown in FIGS. 3 to 5, the bottom plate 4b of the boat 4 has an annular shape. The heat retention tube 19 has a plurality of, e.g., four columns 19a for supporting the lower surface of the bottom plate 4b at suitable intervals in a circumferential direction thereof. More specifically, the heat retention tube 19 is mainly composed of a disc-shaped base part 19b, and the plurality of columns 19a standing out from the base part 19b, and a plurality of heat-shielding plates 19c arranged in a tier-like manner at suitable vertical intervals along the columns 19a via spacers 19j. These constituent members are respectively made of, e.g., quartz.

The column 19a is of a cylindrical shape, and an upper end member 19e for blocking an opening end of the column 19a is integrally formed with an upper end of the column 19a. In order to prevent breakage of the column 19a by a pressure difference between an inside and an outside of the column 19a, holes 19f for communicating the inside and outside of the column 19a are suitably formed in a side surface of the column 19a. The upper end of the column 19a, i.e., the upper end member 19e has a supporting surface 19g for supporting the lower surface of the bottom plate 4b of the boat 4, and a positioning part 19h standing out from the supporting surface 19g to be in contact with an inner circumference of the bottom plate 4b so as to arrange the bottom plate 4b in position. In order to facilitate fitting or engagement of the positioning part 19h with the inner circumference of the bottom plate 4b, an inclined surface 19i is preferably formed at an upper end periphery of the positioning part 19h.

A diameter of a circumscribing circle of the columns 19a, which are arranged at suitable intervals along the circumference direction of the annular bottom plate 4b of the boat 4 so as to support the bottom plate 4b, is smaller than an outer diameter of the bottom plate 4b. Thus, when the second arm 23b of the boat conveying mechanism 23 supports the lower surface of the bottom plate 4b of the boat 4 and moves the boat 4 toward the upper ends of the columns 19a of the heat retention tube 19 to place the boat 4 thereon, the second arm 23b and the columns 19a do not interfere with each other.

The hook groove part 26, which has a groove-like shape and serves as a part to be locked, is formed in an outside part of each of the columns 19a. The hook part 25, which has a hook-like shape (an L-shaped cross section) and serves as a locking part to be locked (hooked) in each hook groove part 26, is disposed on the lower surface of the bottom plate 4b at a position corresponding to the hook groove part 26.

The hook part 25 includes a vertical portion 25a vertically extending downward from the lower surface of the bottom plate 4b, and a horizontal portion 25b radially projecting inward from a lower end of the vertical portion 25a. The hook groove part 26 is formed such that, when the boat 4 is conveyed by the boat conveying mechanism 23 to a position directly above the heat retention tube 19 and the heat retention tube 19 is then rotated by the rotating mechanism 20 at a predetermined angle, the horizontal portion 25b of the hook part 25 is circumferentially inserted into the hook groove part 26. In addition, a groove width and a groove depth of the hook groove part 26 are determined such that the horizontal portion 25b of the hook part 25 do not interfere with (collide with) the hook groove part 26, when the horizontal portion 25b of the hook part 25 is inserted into the hook groove part 26. When the hook portion 25 reaches a predetermined position, i.e., a lockable position in the hook groove part 26, the rotation of the heat retention tube 19 is stopped. Then, the boat 4 is further lowered by the boat conveying mechanism 23 so that the boat 4 is placed on the columns 19a of the heat retention tube 19. With a view to restraining generation of particles, it is preferable that the groove width of the hook groove part 26 is designed such that the horizontal portion 25b of the hook part 25 is not brought into contact (collision) with the hook groove part 26 (see, FIG. 6). It is also preferable that a distal end of the horizontal portion 25b and a bottom surface of the hook groove part 26 are formed into a curved shape (arcuate shape) with a center thereof corresponding to a rotational center of the heat retention tube 19.

Figure 10:
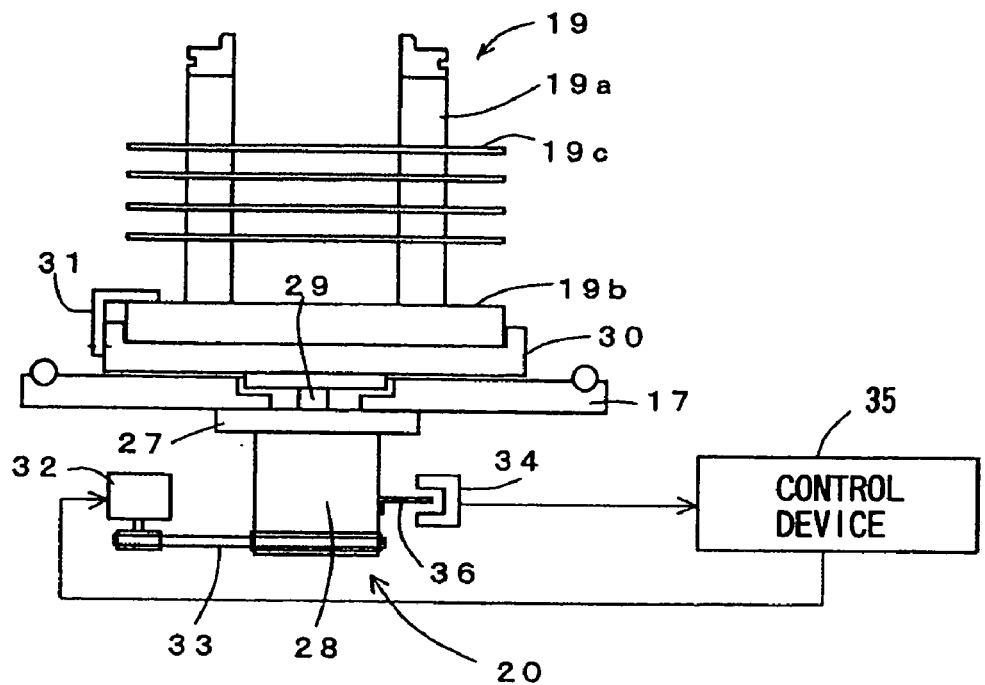
FIG. 10 is a view schematically showing a rotating mechanism of the heat retention tube.
Figure 11:
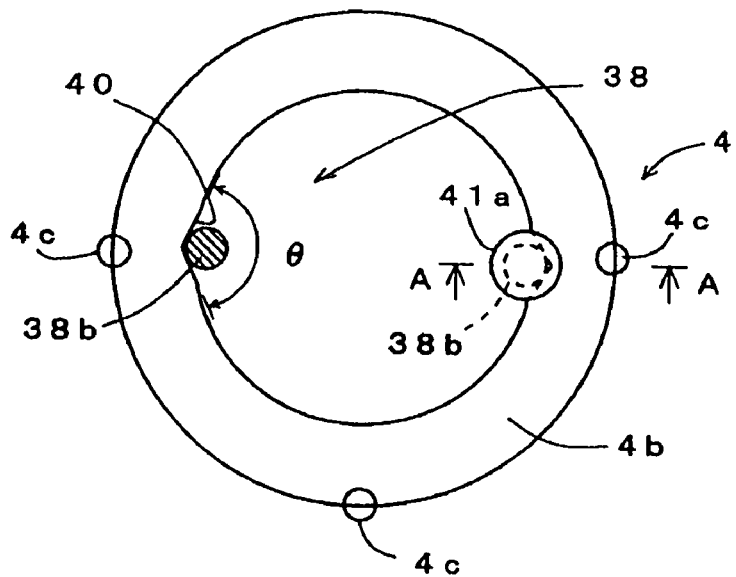
FIG. 11 is a plan view schematically showing a positioning mechanism for the wafer boat on a boat table.
Figure 12:
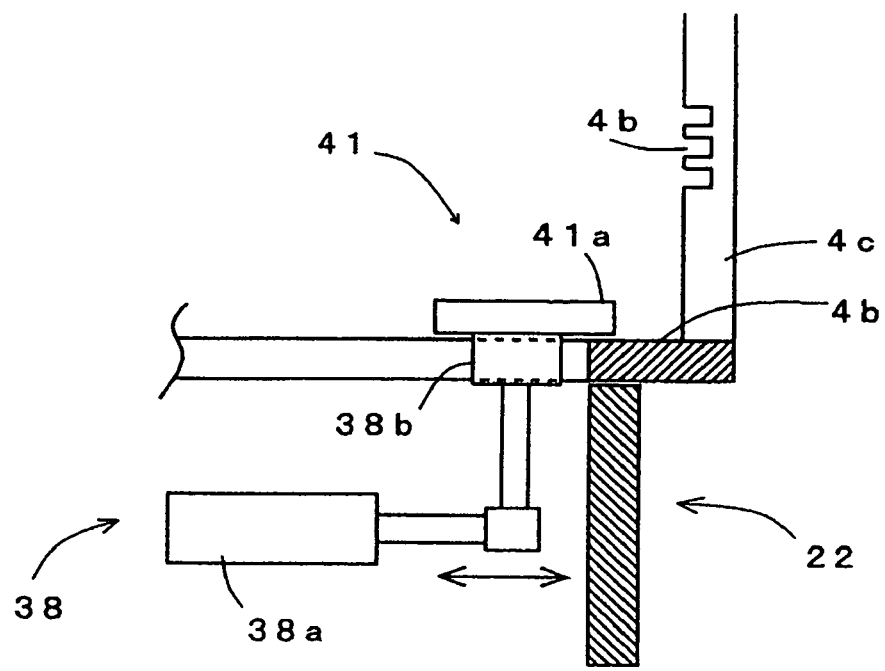
FIG. 12 is an enlarged sectional view taken along the A-A line of FIG. 11.

As the rotating mechanism 20, a rotating mechanism described in JP Patent Publication No. 3579278 is employed, for example. Namely, as shown in FIG. 10, a securing member 27 having a shaft hole is disposed on a side of a bottom part of the lid member 17, and a rotating cylindrical member 28 of a cylindrical shape with a bottom is rotatably positioned below the securing member 27 through a bearing and a magnetic fluid seal, not shown. A rotating shaft 29 is disposed on a bottom part of the rotating cylindrical member 28 so as to be movably passing through the shaft hole of the securing member 27. An upper end of the rotating shaft 29 also movably passes through a central part of the lid member 17, and is connected to a rotating table 30 which is positioned above the lid member 17 with a slight space therebetween. The heat retention tube 19 is placed on the rotating table 30, and the base part 19b of the heat retention tube 19 is secured to the rotating table 30 by a securing member 31. A motor 32 for driving the rotating cylindrical member 28 in rotation is connected to the rotating cylindrical member 28 through a timing belt 33.

In order that the rotation of the heat retention tube 19 can be automatically controlled such that the heat retention tube 19 takes a position in which the hook part 25 and the hook groove part 26 can be locked to each other, or a position in which the hook part 25 and the hook groove part 26 can be unlocked from each other, the rotating mechanism 20 preferably has a sensor 34 for detecting a rotational origin position of the heat retention tube 19, and a control device 35 for controlling the rotation of the heat retention tube 19 based on a detection signal from the sensor 34, such that the heat retention tube 19 takes a position in which the hook part 25 and the hook groove part 26 can be locked to each other, or a position in which the hook part 25 and the hook groove part 26 can be unlocked from each other. For example, a member to be detected (kicker) is projectingly disposed on an outer circumference of the rotating cylindrical member 28, and the sensor 34 for detecting the member to be detected 36 is disposed below the lid member 17. Preferably, the control device 35 can control the heat retention tube 19 such that the boat 4 is successively rotated through the heat retention tube 19 during a heat process.

As shown in FIG. 4, in order to prevent turnover of the boat 4 by an external force such as an earthquake while the boat 4 is conveyed by the boat conveying mechanism 23, a turnover restricting member (not fully shown) is preferably disposed on an upper part of the second arm 23b to restrict the bottom plate 4b by sandwiching the same from above and below between the turnover restricting member and the second arm 23b. The turnover restricting member has a restricting piece 37a which is disposed on an upper surface of a proximal side of the second arm 23b. The restricting piece 37a can face an upper surface of the bottom plate 4b of the boat 4, which is supported on an upper surface of the second arm 23b, with a predetermined space between the restricting piece 37a and the bottom plate 4b.

Further, the following structure is employed for preventing turnover of the boat 4 placed on the boat table 22 by an external force such as an earthquake. As shown in FIGS. 2, 11, 12, 14, and 15, the boat table 22 is provided with a boat positioning mechanism (holder positioning mechanism) 38 for positioning the boat 4. The boat positioning mechanism 38 includes a pair of rollers 38b, which are moved closer to and away from each other on the boat table 22 in a diametrical direction thereof by cylinders 38a. On the other hand, V-shaped positioning engagement grooves 40 are formed in an inner circumference of the bottom plate 4b of the boat 4 at diametrically opposed positions. When the pair of rollers 38b are moved and positioned away from each other, the rollers 38b are engaged with the positioning engagement grooves 40. Each positioning engagement groove 40 is formed to have a predetermined angle θ such as 120 degrees. Thus, even when the boat 4 is placed on the boat table 22 at a position slightly displaced from the correct position, the boat 4 can be exactly arranged in position.

The boat table 22 has a boat gripping mechanism (holder gripping mechanism) 41 for gripping the boat 4 so as to prevent turnover of the same. The boat gripping mechanism 41 has a flange-shaped gripping part 41a. When the rollers 38b are engaged with the positioning engagement grooves 40 (when the rollers are positioned away from each other), the gripping part 41a faces the upper surface of the bottom plate 4b of the boat 4 so as to sandwich the bottom plate 4b between the gripping part 41a and the boat table 22 (in detail, an upper surface of the boat table). Each gripping part 41a is disposed on an upper part of each roller 38b, for example.

The structure of the boat table 22 is described in more detail. The boat table 22 includes a fixed plate 42, and an upper plate 44 that is movably supported in the horizontal direction on the fixed plate 42 via a ball bearing 43. The boat 4 is configured to be placed on the upper plate 44. The fixed plate 42 and the upper plate 44 are formed into an annular shape. The ball bearing 43 has an annular holder 43a, and a number of small balls 43b supported by the holder 43a. The upper plate 44 can be horizontally moved within a predetermined range, by a pin 45 projectingly disposed on one of the upper plate 44 and the fixed plate 42, and by a restricting hole 46 formed in the other thereof in which the pin 45 is loosely fitted. Attached between the upper plate 44 and the fixed plate 42 are a plurality of springs 47 for urging the upper plate 44 such that a center thereof returns to the central position of the boat table 22.

In order to prevent horizontal movement of the upper plate 44 during the transfer of the wafers w, particularly the first table 22a of the boat table 22 is equipped with an upper-plate securing mechanism 48 for securing the upper plate 44 after the boat 4 is arranged in position. The upper-plate securing mechanism 48 includes a frame 49 having a U-shaped cross section. The frame 49 has an upper piece 49a and a lower piece 49b. The upper piece 49a is fixed on a lower surface of the upper plate 44. The frame 49 having a U-shaped cross section sandwiches therein the fixed plate 42 and the ball bearing 43 by the upper piece 49a and the lower piece 49b, with predetermined spaces from above and below. Disposed on the lower piece 49b of the frame 49 is an air cylinder 50 having a stretchable pressing part 50a for securing the fixed plate 42 and the ball bearing 43 sandwiched between the upper piece 49a and the lower piece 49b.

The boat table 22 includes a mounting plate 51 on which the pair of right and left cylinders 38a, 38a are mounted. On the mounting plate 51, there is disposed a guide 53 that movably supports a movable member 52 in the horizontal direction. The roller 38b is supported on an upper end portion of a column 54 standing out from the movable member 52 such that the roller 38b can be rotated about an axis of the column 54. Herein, the gripping part 41a of a flange-like shape is formed on the upper end portion of each roller 38b. Preferably, the roller 38b is made of a heat-resistant resin, since the roller 38b is brought into contact with the bottom plate 4b of the boat 4 after the boat 4 is subjected to a heat process. In addition, a sensor 55 that detects existence of the boat is disposed on one side of the boat table 22. When the sensor 55 detects that the boat 4 has been placed on the boat table 22, positioning of the boat 4 is performed.

Next, an operation (heat processing method) of the vertical heat processing apparatus 1 as structured above is described below. At first, the lid member 17 is elevated, and the boat 4, which is placed on the lid member 17 through the heat retention tube 19 and holds a number of wafers w in a tier-like manner, is loaded into the heat processing furnace 5 together with the heat retention tube 19. Simultaneously, the furnace opening 5a of the heat processing furnace 5 is hermetically sealed by the lid member 17. Then, while the boat 4 is rotated by the operation of the rotating mechanism 20 in the heat processing furnace 5 through the heat retention tube 19, the wafers w are thermally processed for a predetermined period of time, at a predetermined pressure, under a predetermined process gas atmosphere. During this heat process, other wafers w are transferred from and to the other boat 4 on the first table 22a of the boat table 22. In this case, thermally processed wafers w held by the boat 4 are firstly unloaded by the transferring mechanism 24 into a vacant carrier 3 placed on the transfer stage 12. Then, another carrier 3 containing wafers to be thermally processed is conveyed to the transfer stage 12, and the wafers to be thermally processed are moved to the boat 4 which has become vacant.

Upon completion of the heat process in the heat processing furnace 5, the lid member 17 is lowered, and the boat 4 is unloaded from the heat processing furnace 5 to the loading area Sb. The second arm 23b of the boat conveying mechanism 23 comes close to the boat 4 from below (see, FIG. 6), and the second arm 23b raises the boat 4 by a predetermined height (see, FIG. 7). Under this state, the heat retention tube 19 is rotated by the rotating mechanism 20 at a predetermined angle, e.g., 90 degrees, so that the hook part 25 and the hook groove part 26 take an unlockable position in which the hook part 25 and the hook groove part 26 can be unlocked from each other (see, FIG. 8). Thereafter, the second arm 23b of the boat conveying mechanism 23 further raises the boat 4 by another predetermined height (height at which the hook part and the columns of the heat retention tube do not interfere with each other), and conveys the boat 4 toward the second table 22b of the boat table 22 (see, FIG. 9) so as to place the boat 4 thereon. The boat 4 placed on the second table 22b is arranged in position by the positioning mechanism 38, and turnover of the boat 4 is prevented by a flange-shaped turnover restricting part 41a.

Meanwhile, the boat 4 placed on the first table 22a is also positioned by the positioning mechanism 38, and turnover of the boat 4 is prevented by the flange-shaped turnover restricting part 41a. After the restriction of the boat 4 by the turnover restricting part 41a is released, the boat 4 on the first stage 22a is supported by the second arm 23b of the boat conveying mechanism 23 and is conveyed to a position above the heat retention tube 19 of the lid member 17. Then, this boat 4 is lowered to a position above the heat retention tube 19 by the boat conveying mechanism 23. Immediately before the boat 4 is placed on the heat retention tube 19, the heat retention tube 19 is rotated by the rotating mechanism 20 at a predetermined angle, e.g., 90 degrees, so that the hook part 25 and the hook groove part 26 take a lockable position in which the hook part 25 and the hook groove part 26 can be locked to each other. After that, the boat 4 is further lowered to be placed on the heat retention tube 19. In this manner, the placement of the boat 4 onto the heat retention tube 19 is finished. Following thereto, the lid member 17 is elevated to load the boat 4 into the heat processing furnace 5, and a heat process is started. During this heat process, the boat 4 on the second table 22b is conveyed by the boat conveying mechanism 23 to the first table 22a. Then, on the first table 22a, the thermally processed wafers are transferred by the transferring mechanism 24 from this boat 4 to the carrier 3 on the transfer stage 12, and wafers to be processed are transferred by the transferring mechanism 24 from another carrier 3 on the transfer stage 12 to this boat 4. Therefore, improvement in throughput can be achieved.

As described above, in the vertical heat processing apparatus 1 of this embodiment, the hook part 25 and the hook groove part 26 are disposed on the upper part of the heat retention tube 19 and the bottom part of the boat 4, in such a manner that the hook part 25 and the hook groove part 26 become lockable to each other or unlockable from each other, by rotating the heat retention tube 19 at a predetermined angle by the rotating mechanism 20, under a state in which the boat 4 has been located at a position just above the heat retention tube 19 by the boat conveying mechanism 23. Thus, turnover of the boat 4 on the heat retention tube 19 that may be caused by an external force such as an earthquake can be prevented by such a simple structure, while the so-called two-boat system is adopted.

In this embodiment, the boat 4 has the annular bottom plate 4b, the heat retention tube 19 has the plurality of columns 19a that support the lower surface of the bottom plate 4b along a circumferential direction thereof at suitable intervals, the hook groove parts (groove-like parts to be locked) 26 are formed in the outside portions of the respective columns 19a, and the hook parts (hook-like locking part) 25 to be locked in the respective hook groove part 26 are disposed on the lower surface of the bottom plate 4b. Thus, with such a simple structure, a locking operation and an unlocking operation between the heat retention tube 19 and the boat 4 can be securely and easily carried out.

In addition, the rotating mechanism 20 includes the sensor 34 that detects a rotational origin position of the heat retention tube 19, and the control device 35 that controls the rotation of the heat retention tube 19 based on a detection signal from the sensor 34, such that the hook part 25 and the hook groove part 26 take a position in which the hook part 25 and the hook groove part 26 can be locked to each other, or a position in which the hook part 25 and the hook groove part 26 can be unlocked from each other. Thus, a locking operation and an unlocking operation between the heat retention tube 19 and the boat 4 can be securely and easily carried out.

On the other hand, in the vertical heat processing apparatus 1, the boat gripping mechanism 41 for gripping the boat 4 to prevent turnover thereof is disposed on the boat table 22, and thus the boat 4 which has been conveyed to the boat table 22 can be gripped so as not to turn over. Thus, turnover of the boat 4 on the boat table 22 by an external force such as an earthquake can be prevented by such a simple structure, while the so-called two-boat system is adopted.

In this embodiment, on the boat table 22, by enlarging a distance between the pair of rollers 38b of the boat positioning mechanism 38, which can be widened and narrowed, the rollers 38b are engaged with the positioning engagement grooves 40 formed in the inner circumference of the annular bottom plate 4b of the boat 4. Thus, the boat 4 is arranged in position. The boat gripping mechanism 41 has the gripping parts 41a. When the rollers 38b of the boat positioning mechanism 38 is moved and positioned away from each other (after the rollers are moved and positioned away from each other), the gripping parts 41a face the upper surface of the bottom plate 4b of the boat 4 so as to sandwich the bottom plate 4b between the gripping parts 41a and the boat table 22. In particular, each griping part 41a is disposed on the upper end portion of each roller 38b. Thus, simultaneously with the positioning of the boat 4, turnover of the boat 4 on the boat table 22 by an external force such as an earthquake can be prevented. Moreover, since the gripping part 41a can be formed only by improving the roller 38b of the boat positioning mechanism 38, a simplified structure and a reduced cost can be realized.

Figure 13:
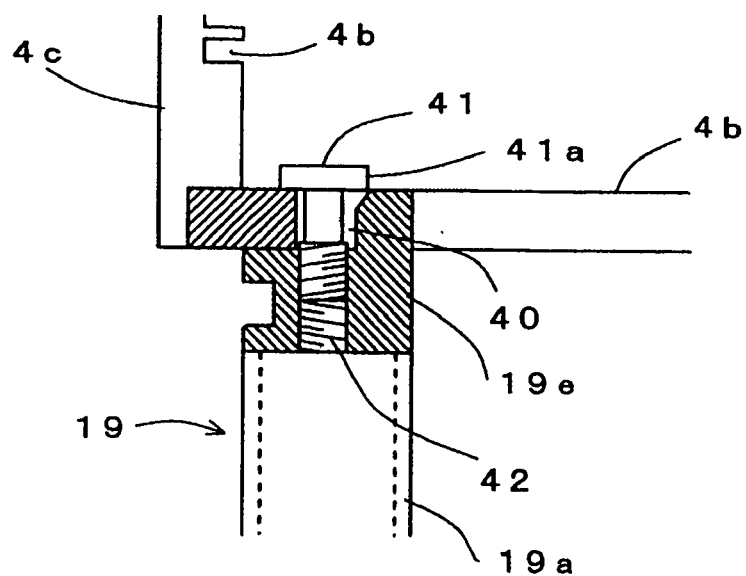
FIG. 13 is an enlarged sectional view of a main part of a modification of the heat retention tube.
Figure 14A:
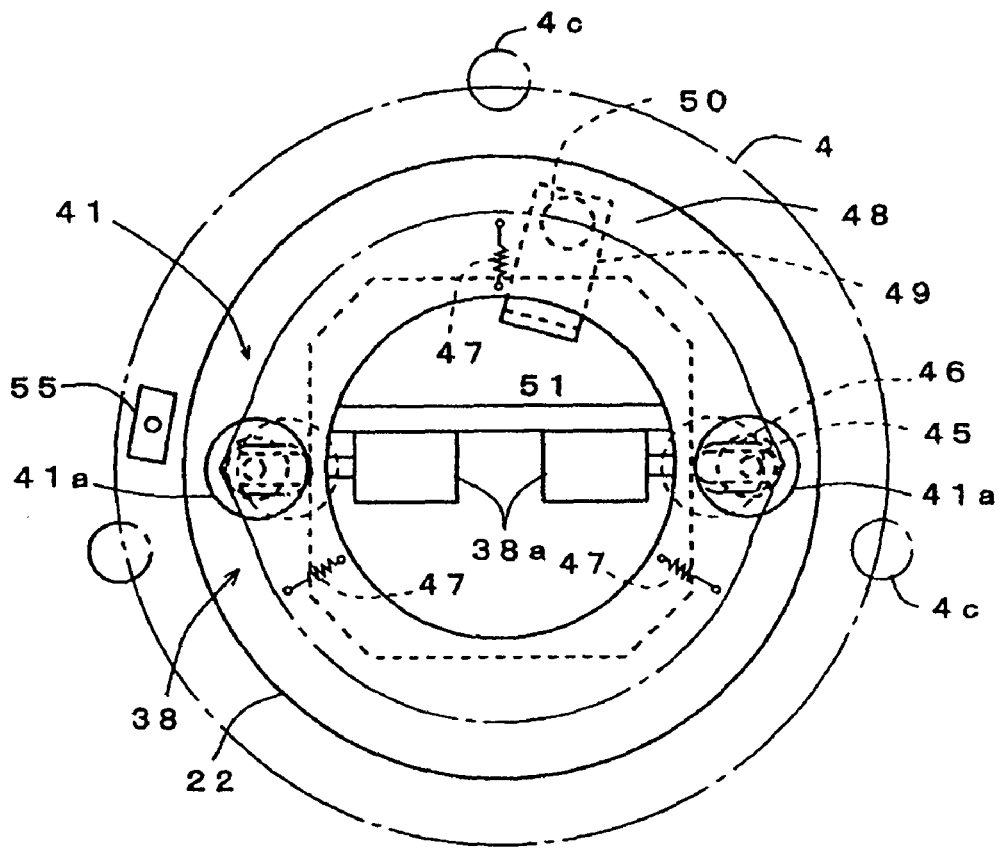
FIG. 14A is a schematic plan view showing another example of the boat table.
Figure 14B:
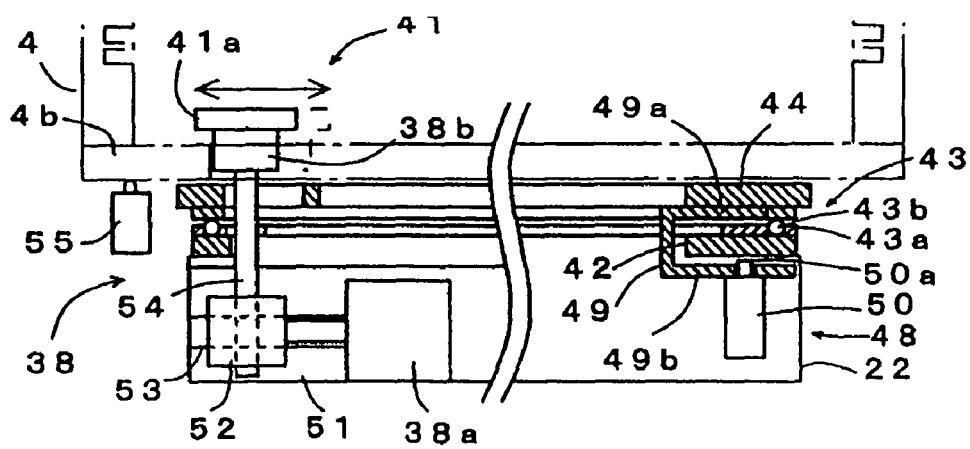
FIG. 14B is a schematic sectional view of the boat table shown in FIG. 14A.
Figure 15A:
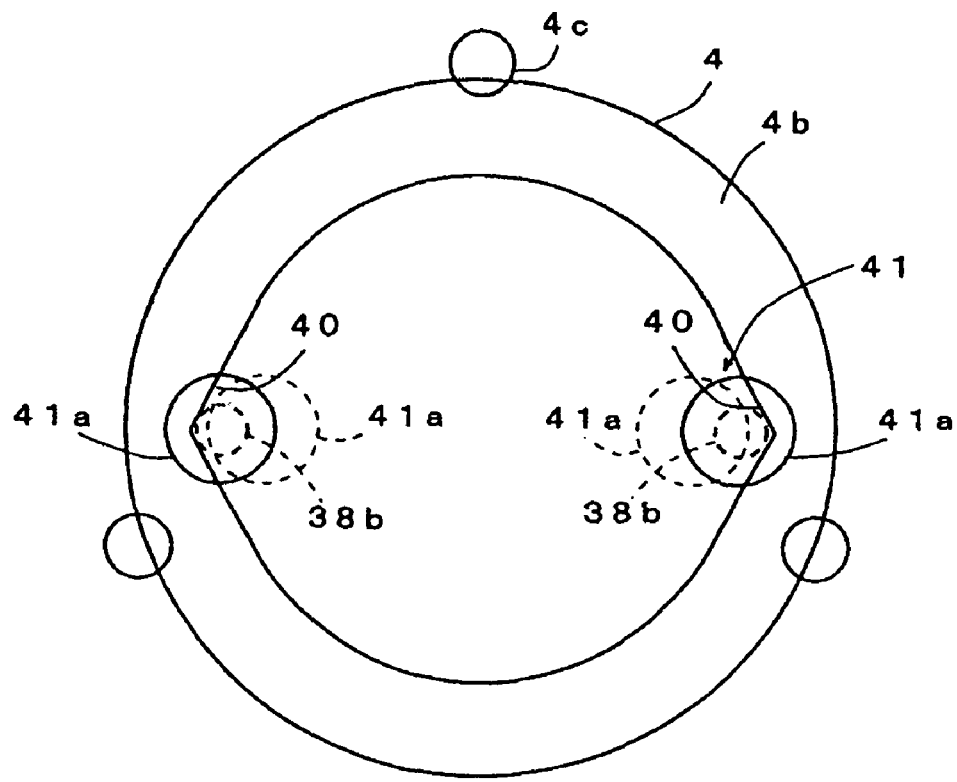
FIG. 15A is a schematic plan view of an example of a boat gripping mechanism.
Figure 15B:
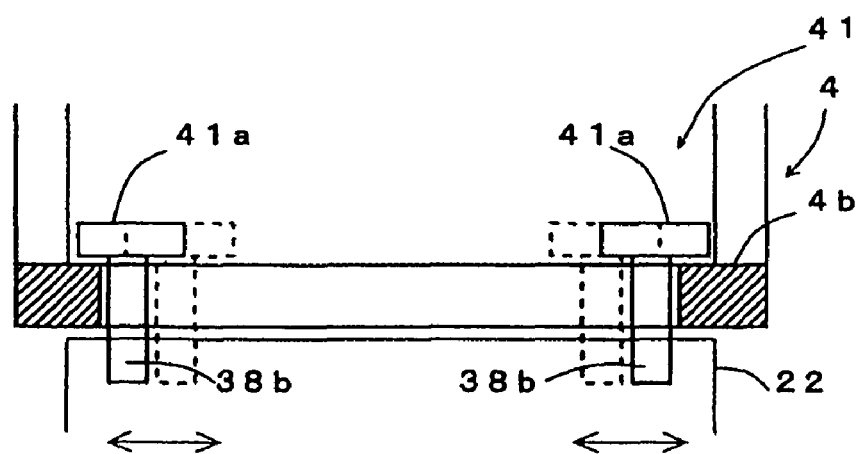
FIG. 15B is a schematic sectional view of the boat gripping mechanism shown in FIG. 15A.

FIG. 13 is an enlarged sectional view of a main part of a modification of the heat retention tube. In a heat retention tube 19 of the embodiment shown in FIG. 13, a screw hole 42 is formed in an upper end member 19e of a column 19a. Due to the screw hole 42, a bottom plate 4b of a boat 4 can be fastened to the column 19a by a screw 41. The screw 41 is passed through a V-shaped engagement groove 40 of the bottom plate 4b and is screwed in the screw hole 42, so that a head 41a of the screw 41 clamps an upper surface of the bottom plate 4b to thereby fasten the bottom plate 4b to the column 19a. According to such a heat retention tube 19, the heat retention tube 19 and the boat 4, which are fastened to each other by the screw 41, can be used in a one-boat system. On the other hand, by detaching the screw 41, the heat retention tube 19 and the boat 4 can be used in the two-boat system.

Figure 16A:
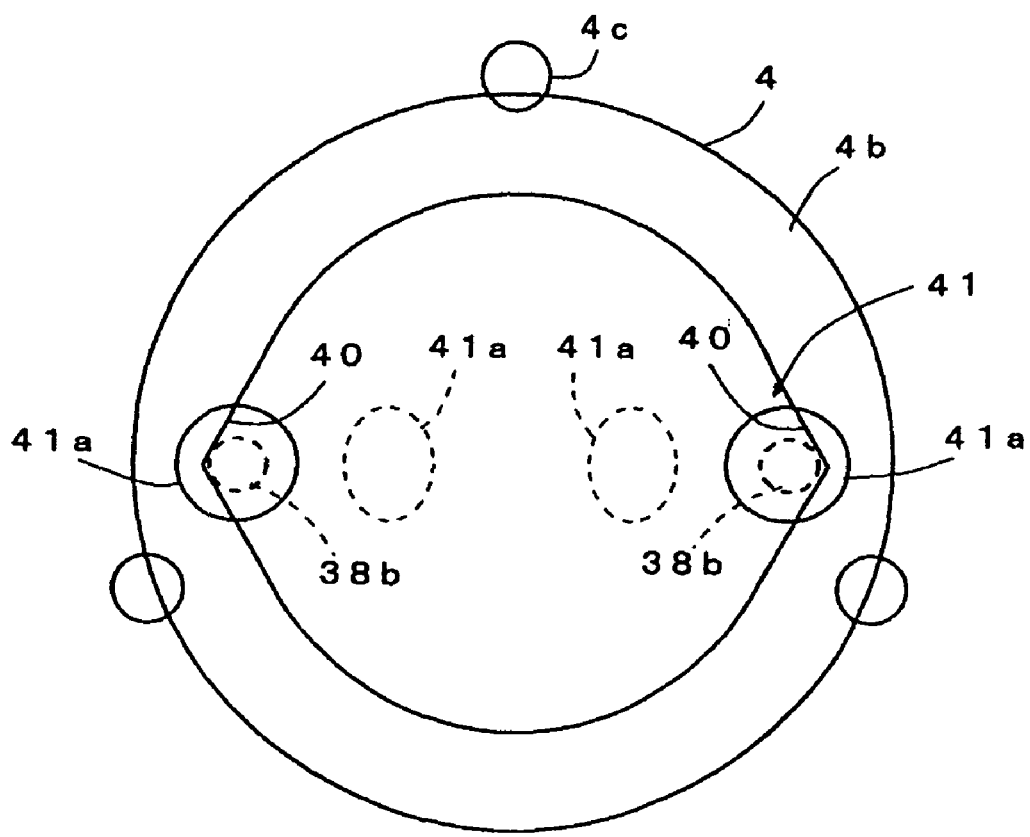
FIG. 16A is a schematic plan view of another example of the boat gripping mechanism.
Figure 16B:
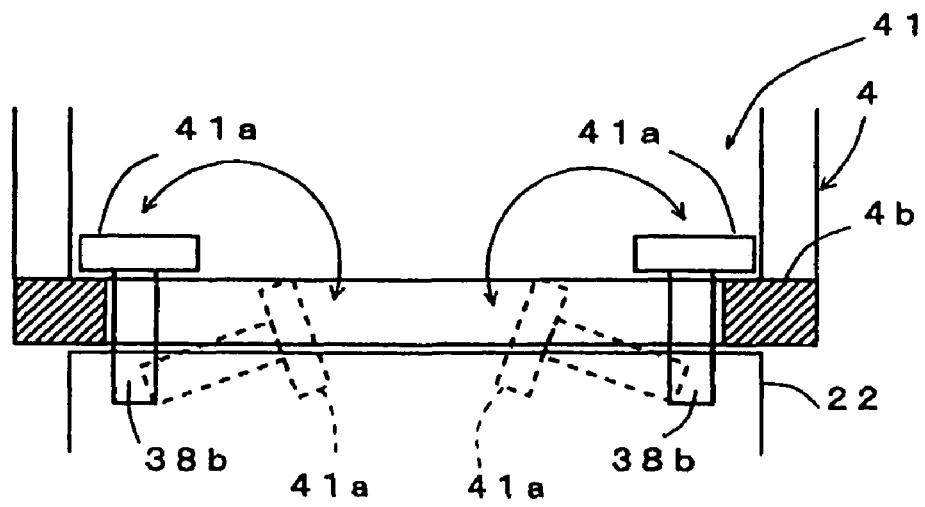
FIG. 16B is a schematic sectional view of the boat gripping mechanism shown in FIG. 16A.

FIG. 16A is a schematic plan view of another example of the boat gripping mechanism, and FIG. 16B is a schematic sectional view of the boat gripping mechanism shown in FIG. 16A. In a boat table 22 of this embodiment, there are disposed a pair of rollers 38b, each of which can change a posture thereof between an inclined position that is radially inward inclined and an upright position. By positioning the pair of rollers 38b at the upright positions, the pair of rollers 38b can be engaged respectively with positioning engagement grooves 40 formed in an inner circumference of an annular bottom plate 4b of a boat 4. Thus, positioning of the boat 4 is performed. A boat gripping mechanism 41 has a gripping part 41a. When the rollers 38b of the boat positioning mechanism 38 are made upright (after the rollers are made upright), the gripping part 41a faces an upper surface of the bottom plate 4b of the boat 4 so as to sandwich the bottom plate 4b between the gripping part 41a and the boat table 22. In particular, the griping part 41a is disposed on an upper end portion of the roller 38b. According to this boat table 22, the same operation and effect as described above can be obtained.

Figure 17A:
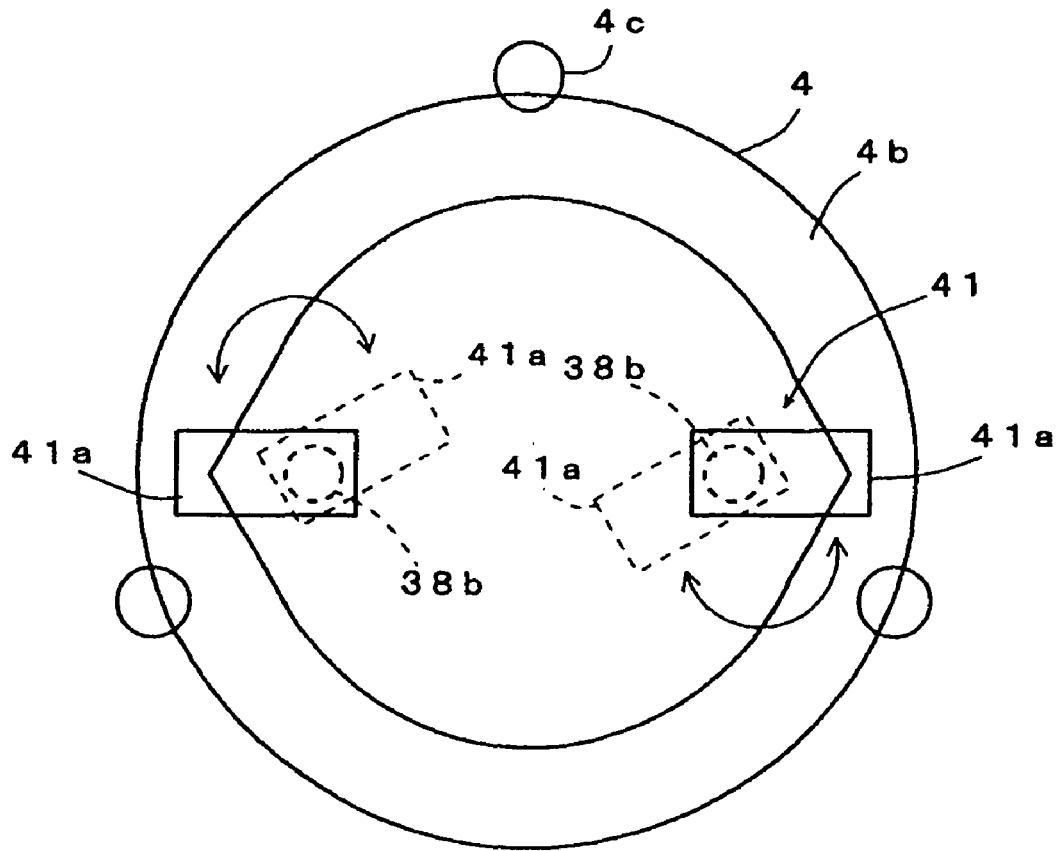
FIG. 17A is a schematic plan view of a still another example of the boat gripping mechanism.
Figure 17B:
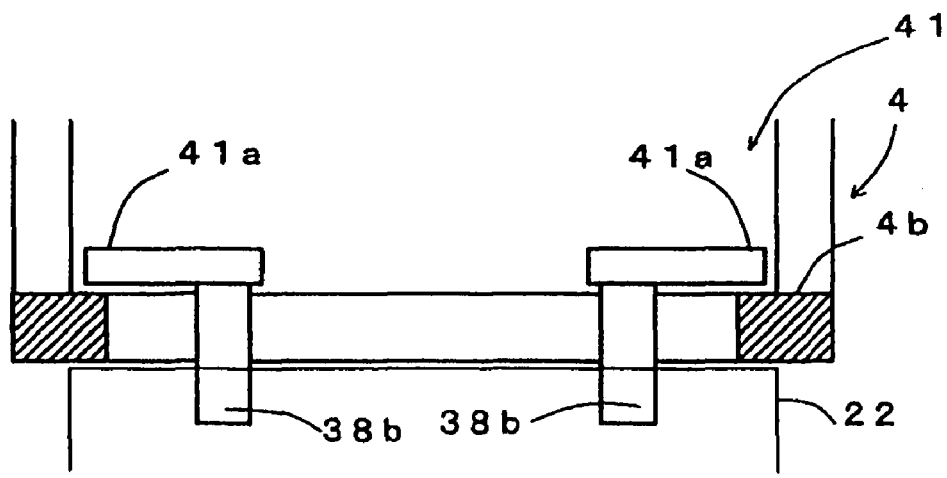
FIG. 17B is a schematic sectional view of the boat gripping mechanism shown in FIG. 17A.

FIG. 17A is a schematic plan view of a still another example of the boat gripping mechanism, and FIG. 17B is a schematic sectional view of the boat gripping mechanism shown in FIG. 17A. In a boat table 22 of this embodiment, there are disposed a pair of rollers 38b. A distance between the pair of rollers 38b can be widened and narrowed. By enlarging the distance between the rollers 38b and rotating the same, the rollers 38b are engaged with positioning engagement grooves 40 formed in an inner circumference of an annular bottom plate 4b of a boat 4. Thus, positioning of the boat 4 is performed. A boat gripping mechanism 41 has a gripping part 41a. When the rollers 38b of the boat positioning mechanism 38 are moved and positioned away from each other and rotated (after the rollers are moved and positioned away from each other and rotated), the gripping part 41b faces an upper surface of the bottom plate 4b of the boat 4 so as to sandwich the bottom plate 4b between the gripping part 41a and the boat table 22. In particular, the griping part 41a is disposed on an upper end portion of the roller 38b. According to this boat table 22, the same operation and effect as described above can be obtained. In order to smoothly rotate the rollers 38b, it is preferable that, after the positioning of the boat 4 by moving the rollers 38 away from each other (separating the rollers 38b away from each other) is finished, the distance is once narrowed (the rollers 38 are moved close to each other), and then the rollers 38 are rotated.

The embodiments of the present invention have been described in detail with reference to the drawings. However, the present invention is not limited to the above respective embodiments, and various changes in design are possible without departing from the scope of the present invention.

What is claimed is:

1. A vertical heat processing apparatus comprising:
   a heat processing furnace having a furnace opening;
   a lid member for closing the furnace opening of the heat processing furnace;
   a first substrate holder and a second substrate holder, each of which is capable of holding a plurality of substrates in a tier-like manner and of being alternately placed on the lid member through a heat retention tube;
   an elevating mechanism that vertically moves the lid member to load one of the substrate holders into the heat processing furnace, and to unload the one of the substrate holders from the heat processing furnace;
   a holder table configured to be placed thereon the other of the substrate holders for transfer of the substrates, when the one of the substrate holders is in the heat processing furnace; and
   a holder conveying mechanism configured to convey the respective substrate holders between the holder table and the heat retention tube, wherein
   the holder table is provided with a holder gripping mechanism for gripping the substrate holder to prevent turnover thereof,
   each of the substrate holders includes an annular bottom plate,
   positioning engagement grooves are formed in an inner circumference of the bottom plate,
   the holder table is provided with a holder positioning mechanism having a pair of rollers that can be moved closer to and away from each other to narrow and widen a distance therebetween,
   the holder positioning mechanism is adapted to position the substrate holder by enlarging the distance between the pair of rollers to thereby engage the pair of rollers respectively with the positioning engagement grooves, and
   the holder gripping mechanism includes a gripping part for gripping the bottom plate when the pair of rollers are positioned away from each other.

2. A method of thermally processing a plurality of substrates using the vertical heat processing apparatus according to claim 1, the method comprising the steps of:
   causing the one of the substrate holders to hold a plurality of substrates in a tier-like manner;
   placing the one substrate holder holding the plurality of substrates in a tier-like manner, on the lid member for closing the furnace opening of the heat processing furnace, through the heat retention tube;
   elevating the lid member to load the one substrate holder into the heat processing furnace;
   thermally processing the substrates held by the one substrate holder in the heat processing furnace;
   causing the holder table to grip the other of the substrate holders to prevent turnover thereof, by using the gripping part that grips the bottom plate when the pair of rollers are positioned away from each other;
   transferring substrates to or from the other substrate holder placed on the holder table, during the thermal processing step; and
   replacing the one substrate holder on the heat retention tube, which has been unloaded from the heat processing furnace, with the other substrate holder on the holder table, after the thermal processing step.

3. A vertical heat processing apparatus comprising:
   a heat processing furnace having a furnace opening;
   a lid member for closing the furnace opening of the heat processing furnace;
   a first substrate holder and a second substrate holder, each of which is capable of holding a plurality of substrates in a tier-like manner and of being alternately placed on the lid member through a heat retention tube;
   an elevating mechanism that vertically moves the lid member to load one of the substrate holders into the heat processing furnace, and to unload the one of the substrate holders from the heat processing furnace;
   a holder table configured to be placed thereon the other of the substrate holders for transfer of the substrates, when the one of the substrate holders is in the heat processing furnace; and
   a holder conveying mechanism configured to convey the respective substrate holders between the holder table and the heat retention tube, wherein
   the holder table is provided with a holder gripping mechanism for gripping the substrate holder to prevent turnover thereof,
   each of the substrate holders includes an annular bottom plate,
   positioning engagement grooves are formed in an inner circumference of the bottom plate,
   the holder table is provided with a holder positioning mechanism having a pair of rollers, each of which can change a posture thereof between an inclined position that is radially inwardly inclined and an upright position,
   the holder positioning mechanism is adapted to position the substrate holder by making upright the pair of rollers to thereby engage the pair of rollers respectively with the positioning engagement grooves, and
   the holder gripping mechanism includes a gripping part for gripping the bottom plate when the pair of rollers are positioned upright.

4. A method of thermally processing a plurality of substrates using the vertical heat processing apparatus according to claim 3, the method comprising the steps of:
   causing the one of the substrate holders to hold a plurality of substrates in a tier-like manner;
   placing the one substrate holder holding the plurality of substrates in a tier-like manner, on the lid member for closing the furnace opening of the heat processing furnace, through the heat retention tube;
   elevating the lid member to load the one substrate holder into the heat processing furnace;

thermally processing the substrates held by the one substrate holder in the heat processing furnace;

causing the holder table to grip the other of the substrate holders to prevent turnover thereof, by using the gripping part that grips the bottom plate when the pair of rollers are positioned upright;

transferring substrates to or from the other substrate holder placed on the holder table, during the thermal processing step; and replacing the one substrate holder on the heat retention tube, which has been unloaded from the heat processing furnace, with the other substrate holder on the holder table, after the thermal processing step.

5. A vertical heat processing apparatus comprising:

a heat processing furnace having a furnace opening;

a lid member for closing the furnace opening of the heat processing furnace;

a first substrate holder and a second substrate holder, each of which is capable of holding a plurality of substrates in a tier-like manner and of being alternately placed on the lid member through a heat retention tube;

an elevating mechanism that vertically moves the lid member to load one of the substrate holders into the heat processing furnace, and to unload the one of the substrate holders from the heat processing furnace;

a holder table configured to be placed thereon the other of the substrate holders for transfer of the substrates, when the one of the substrate holders is in the heat processing furnace; and a holder conveying mechanism configured to convey the respective substrate holders between the holder table and the heat retention tube, wherein the holder table is provided with a holder gripping mechanism for gripping the substrate holder to prevent turnover thereof, each of the substrate holders includes an annular bottom plate, positioning engagement grooves are formed in an inner circumference of the bottom plate, the holder table is provided with a holder positioning mechanism having a pair of rollers that can be moved closer to and away from each other to narrow and widen a distance therebetween and that can be rotated about axes thereof, the holder positioning mechanism is adapted to position the substrate holder by enlarging the distance between the pair of rollers and by rotating the pair of rollers to thereby engage the pair of rollers respectively with the positioning engagement grooves, and the holder gripping mechanism includes a gripping part for gripping the bottom plate when the pair of rollers are positioned away from each other and rotated.

6. A method of thermally processing a plurality of substrates using the vertical heat processing apparatus according to claim 5, the method comprising the steps of:

causing the one of the substrate holders to hold a plurality of substrates in a tier-like manner;

placing the one substrate holder holding the plurality of substrates in a tier-like manner, on the lid member for closing the furnace opening of the heat processing furnace, through the heat retention tube;

elevating the lid member to load the one substrate holder into the heat processing furnace;

thermally processing the substrates held by the one substrate holder in the heat processing furnace;

causing the holder table to grip the other of the substrate holders to prevent turnover thereof, by using the gripping part that grips the bottom plate when the pair of rollers are positioned away from each other and rotated;

transferring substrates to or from the other substrate holder placed on the holder table, during the thermal processing step; and replacing the one substrate holder on the heat retention tube, which has been unloaded from the heat processing furnace, with the other substrate holder on the holder table, after the thermal processing step.

* * * * *